United States Patent
Kim

(10) Patent No.: US 7,696,053 B2
(45) Date of Patent: Apr. 13, 2010

(54) IMPLANTATION METHOD FOR DOPING SEMICONDUCTOR SUBSTRATE

(75) Inventor: Tae Woo Kim, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 352 days.

(21) Appl. No.: 11/614,586

(22) Filed: Dec. 21, 2006

(65) Prior Publication Data
US 2007/0145432 A1    Jun. 28, 2007

(30) Foreign Application Priority Data
Dec. 27, 2005    (KR) .................. 10-2005-0130908

(51) Int. Cl.
*H01L 21/426* (2006.01)
(52) U.S. Cl. ............... 438/305; 438/517; 438/529; 438/532; 257/E21.147
(58) Field of Classification Search ............ 438/529
See application file for complete search history.

(56) References Cited

U.S. PATENT DOCUMENTS

| 2001/0044191 | A1* | 11/2001 | Huang-Lu et al. | 438/305 |
| 2002/0164858 | A1* | 11/2002 | Sayama et al. | 438/289 |
| 2004/0173855 | A1* | 9/2004 | Masuoka et al. | 257/371 |

FOREIGN PATENT DOCUMENTS

KR    100172250 B1    10/1998

* cited by examiner

*Primary Examiner*—Stephen W Smoot
(74) *Attorney, Agent, or Firm*—Sherr & Vaughn, PLLC

(57) ABSTRACT

Embodiments relate to a semiconductor device that may include a gate stack formed on an upper portion of an active region in a semiconductor substrate, the gate stack including a gate insulating layer and a gate, a first shallow impurity region formed on both sides of the gate in the semiconductor substrate, a gate spacer layer formed on one side of the gate stack, and a second deep impurity region formed in the semiconductor substrate by using the gate spacer layer as a mask, in which the gate is formed by implanting p-type ions.

4 Claims, 5 Drawing Sheets

IMPLANTATION METHOD FOR DOPING SEMICONDUCTOR SUBSTRATE

The present application claims priority under 35 U.S.C. 119 and 35 U.S.C. 365 to Korean Patent Application No. 10-2005-0130908 (filed on Dec. 27, 2005), which is hereby incorporated by reference in its entirety.

BACKGROUND

In a typical manufacturing process of a semiconductor device, a polysilicon layer may be used as an electrode that maybe fabricated through deposition and ion implantation processes. The ion implantation process may form doped polysilicon by implanting ions into deposited undoped polysilicon.

After the ion implantation process, a subsequent heat treatment process may be necessary, and may maximize a size of a grain and reduce sheet resistance. However, in a P+ polysilicon gate forming process, a subsequent heat treatment process may be performed, which may cause boron ions to spread to a gate electrode.

Referring to FIG. 1, according to the related art, a polysilicon layer in the vicinity of a gate oxide layer interface may maintain constant boron concentration. However, since boron in the vicinity of the gate oxide layer interface in the polysilicon layer may have a depth profile distribution of less than a prescribed concentration, and electrical property of a device may deteriorate due to poly depletion.

However, according to the related art as shown in FIG. 1, since a gate depth is narrow for a region "b" in which boron of more than certain concentration exists in the vicinity of the gate oxide layer interface, gate depletion may occur.

Further, according to the related art, since the boron ions may be introduced to the gate oxide layer through the subsequent heat treatment process, certain electrical characteristics may deteriorate.

Furthermore, according to the related art, when a gate structure is formed using the polysilicon, a performance of a transistor may be limited due to the gate depletion. For example, the performance of a PMOSFET transistor may be inferior to a NMOSFET transistor.

SUMMARY

Embodiments relate to a semiconductor device and a method for manufacturing the same.

Embodiments relate a semiconductor device that may be capable of overcoming the degradation of a PMOSFET transistor due to depletion occurring in an existing polysilicon gate structure, and a method for manufacturing the same.

Embodiments relate to a semiconductor device that may improve a performance of a PMOSFET transistor by improving gate depletion, and a method for manufacturing the same.

In embodiments, a semiconductor device may include a gate stack formed on an upper portion of an active region in a semiconductor substrate, the gate stack including a gate insulating layer and a gate, a first shallow impurity region formed on both sides of the gate in the semiconductor substrate, a gate spacer layer formed on one side of the gate stack, and a second deep impurity region formed in the semiconductor substrate by using the gate spacer layer as a mask, wherein the gate may be formed by implanting p-type ions.

In embodiments, a method for manufacturing a semiconductor device may include sequentially laminating a gate insulating layer and a polysilicon layer on an upper portion of an active region in a semiconductor substrate, forming a photo resist layer on the polysilicon layer, implanting p-type ions on the polysilicon layer by using the photo resist layer as a mask, forming a gate stack by etching the gate insulating layer and the polysilicon layer, implanting impurity ions in order to form a first shallow impurity region in the semiconductor substrate after the gate stack may be formed, and forming a gate spacer layer on one side of the gate stack, and implanting impurity ions in order to form a second deep impurity region in the semiconductor substrate by using the gate spacer layer as a mask.

DETAILED DESCRIPTION OF EMBODIMENTS

Figure 1:
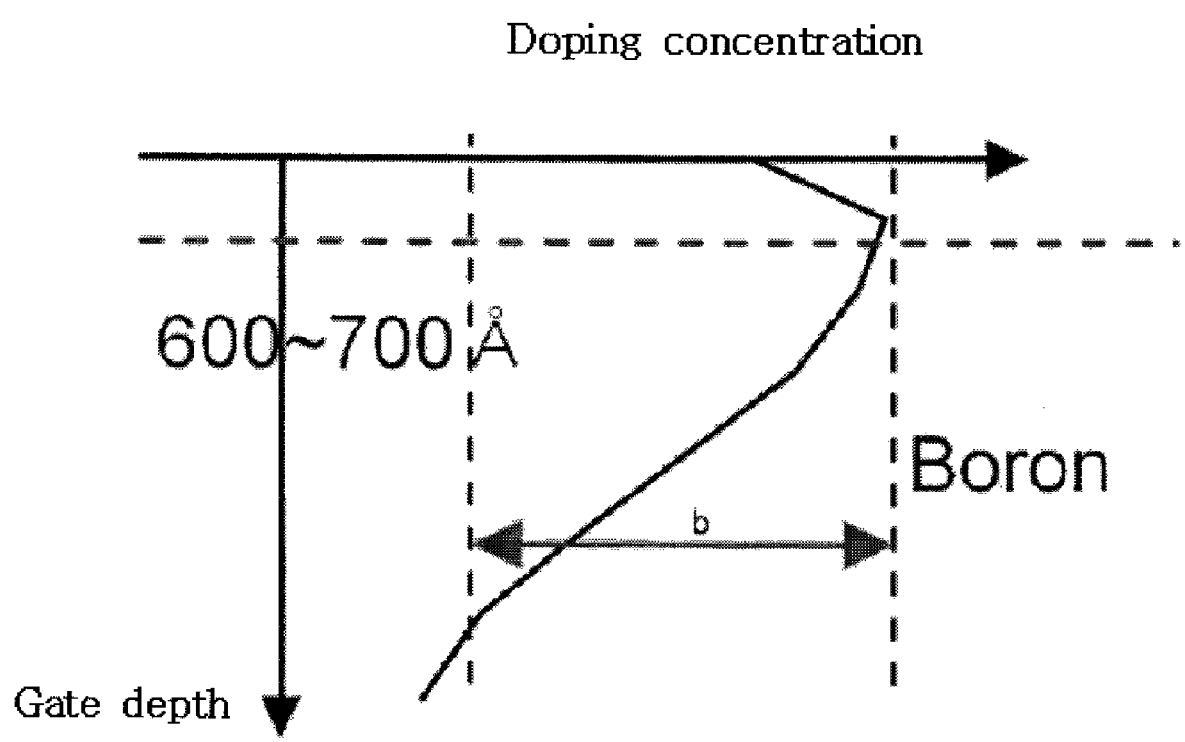
FIG. 1 is an example diagram illustrating the gate depletion of a semiconductor device manufactured according to the related art.
Figure 2:
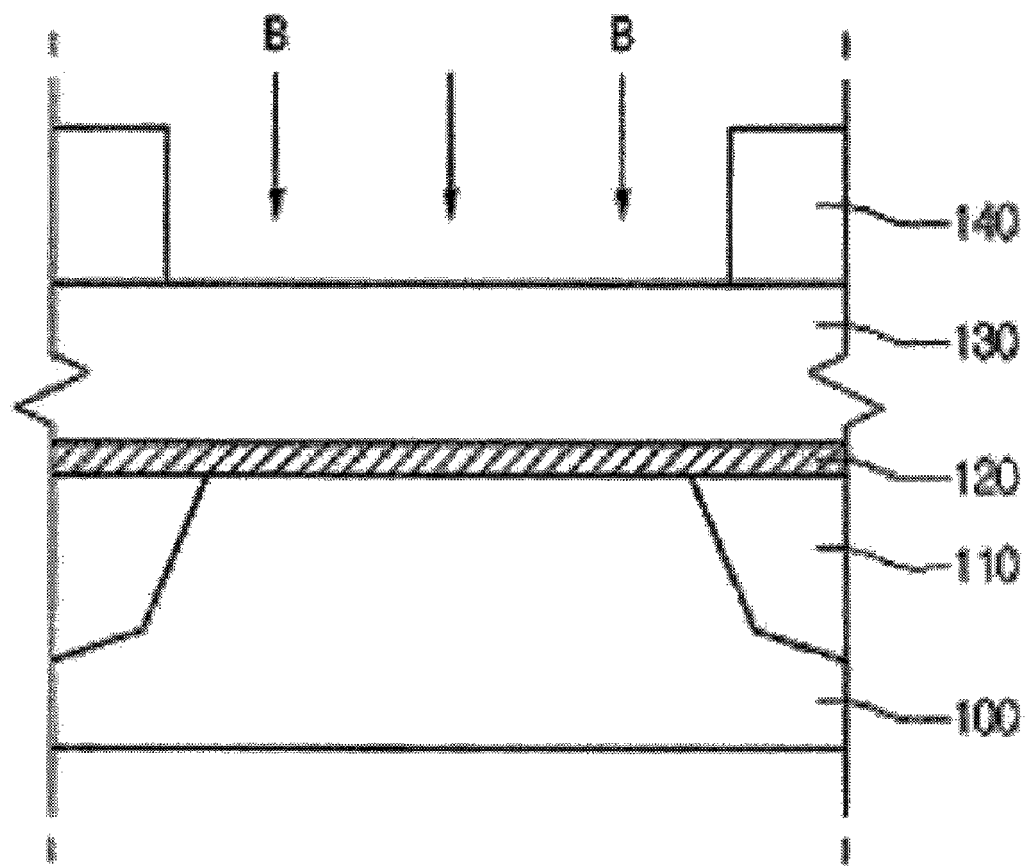
FIGS. 2 to 4 are example sectional diagrams illustrating a method for manufacturing a semiconductor device according to embodiments.
Figure 3:
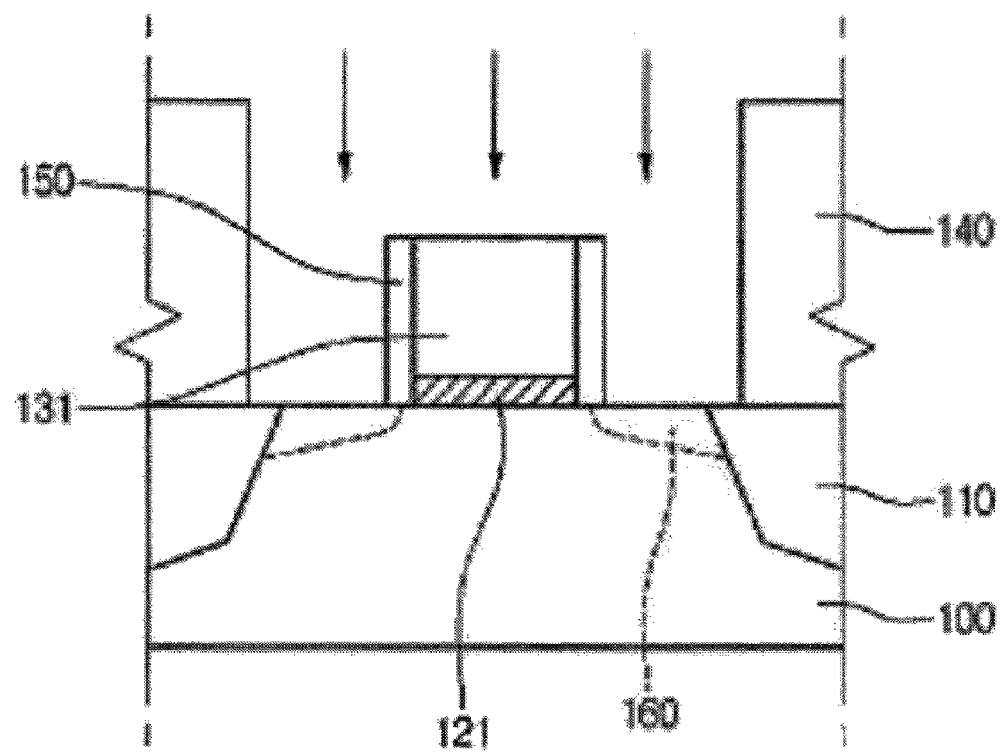
Figure 4:
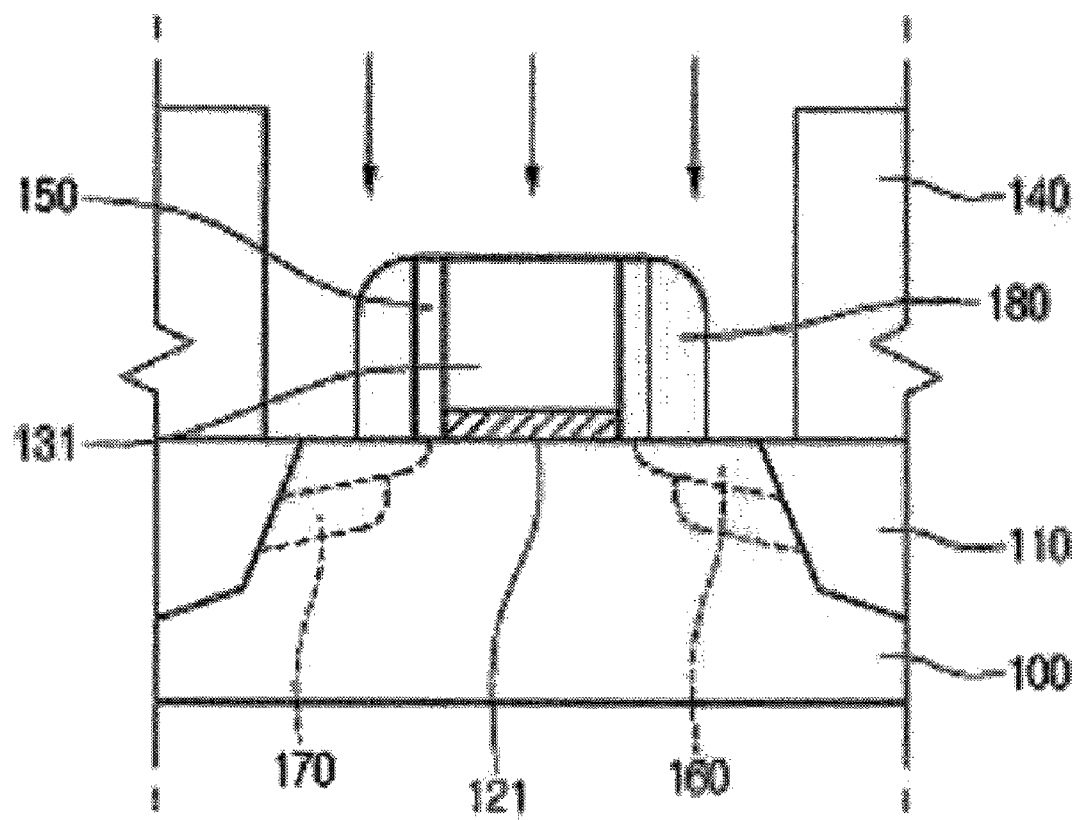

FIGS. 2 to 4 are example sectional views illustrating a semiconductor device and a method for manufacturing the same according to an embodiment.

According to embodiments, a P-channel MOS transistor (hereinafter, referred to as transistor) is described. However, embodiments also relate to N-channel MOS transistor. Further, embodiments relate to manufacturing a complementary MOS transistor in which the N-channel MOS transistor and the P-channel MOS transistor may be formed in a single substrate.

Referring to FIG. 2, isolation layer 110 may be formed on n-type semiconductor substrate 100, and may isolate an active layer in which a transistor may be formed. Isolation layer 110 may use a trench type isolation layer.

Gate insulating layer 120 and polysilicon layer 130 may be sequentially laminated on an upper portion of the active layer in semiconductor substrate 100.

Photo resist layer 140 may be formed on polysilicon layer 130 separately from an adjacent transistor, for example an NMOSFET transistor, so that an ion implantation process may be carried out.

A primary boron ion implantation process may be performed for a region (for example, PMOSFET transistor region) of polysilicon layer 130 by using photo resist layer 140 as a mask.

According to embodiments, in the primary boron ion implantation process, boron ions may be implanted with an energy of approximately 40 to 50 keV.

According to embodiments, the boron ions may be implanted after formation of polysilicon layer 130. A proper depth profile may therefore be maintained in the PMOSFET transistor region after a gate layer may be formed.

Referring to FIG. 3, gate insulating layer 120 and polysilicon layer 130 may be etched to form a gate stack including gate insulating layer 121 and gate conductive layer 131.

A secondary boron ion implantation process may be performed on a surface (for example, the entire surface) of gate insulating layer 121 and gate conductive layer 131. In embodiments, P-type impurities, e.g. boron ions or $BF_3$ ions, may be implanted to form first shallow impurity region 160 with a low concentration.

According to embodiments, first gate spacer layer 150 may be formed on the sidewall of the gate stack formed before the secondary boron ion implantation process. In embodiments, first gate spacer layer 150 may be made from a Tetra Ethoxy Silane (TEOST) oxide layer and may have a thickness of about 100 to 300 Å.

Referring to FIG. 4, second gate spacer layer 180 may be formed on one side of gate conductive layer 131, and a tertiary ion implantation process may be performed by using second gate spacer layer 180 as a mask.

In the tertiary ion implantation process, ions belonging to p-type impurities may be implanted with an energy of approximately 10 to 20 keV so as to form second deep impurity region 170 with a high concentration.

After the tertiary ion implantation process, a diffusion process may be further carried out and may diffuse the implanted impurity ions. In embodiments, the diffusion process may include a rapid heat treatment process performed in a temperature of about 700 to 1050 degrees Celsius and N2 atmosphere during about 5 to 30 seconds.

Figure 5:
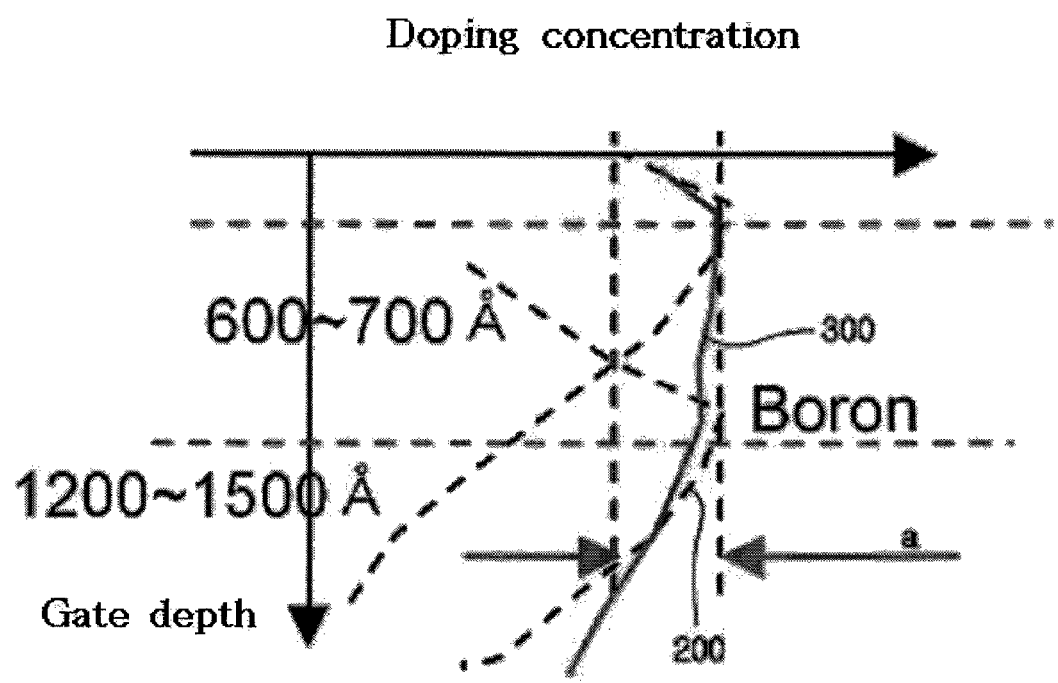
FIG. 5 is an example diagram illustrating a gate depletion in a semiconductor device manufactured according to embodiments.

FIG. 5 is an example diagram illustrating the gate depletion in a semiconductor device manufactured according to embodiments.

Referring to FIG. 5, according to embodiments, boron ions may be implanted into the polysilicon layer with a prescribed energy, so that a property curve may be obtained as shown in reference numeral 200. After performing a heat treatment in a subsequent process, a property curve may be obtained as shown in reference numeral 300.

According to embodiments, a gate depth may be extended for a region "a" in which boron of more than certain concentration exists in the vicinity of the gate oxide layer interface. Gate depletion may accordingly be improved.

According to embodiments, boron ions may be primarily implanted to the PMOSFET transistor after formation of the polysilicon layer, and ions may be implanted with an energy of 10 to 20 keV and may form a deep impurity region. Accordingly, a boron depth profile may be improved.

According to a embodiments, it may be possible to solve the degradation of a FET transistor due to depletion occurring in an existing polysilicon structure.

Further, according to embodiments, gate depletion may be improved, and a performance of a transistor (for example, a PMOSFET transistor) may be improved.

It will be apparent to those skilled in the art that various modifications and variations may be made to embodiments. Thus, it is intended that embodiments cover modifications and variations thereof within the scope of the appended claims. It is also understood that when a layer is referred to as being "on" or "over" another layer or substrate, it may be directly on the other layer or substrate, or intervening layers may also be present.

What is claimed is:

1. A method comprising:
    forming a gate stack comprising a gate and a gate insulating layer over a semiconductor substrate, wherein forming the gate stack comprises:
        sequentially laminating an insulating layer and a polysilicon layer on an upper portion of an active region of the semiconductor substrate;
        forming a photoresist layer on the polysilicon layer;
        implanting p-type ions on the polysilicon layer using the photoresist layer as a mask, wherein, in implanting the p-type ions, boron ions are implanted, wherein the boron ions are implanted with an energy of 40 to 50 keV; and
        forming the gate stack by etching the gate insulating layer and the polysilicon layer;
    forming a first gate spacer layer on at least one side of the gate stack;
    forming a first shallow impurity region in the semiconductor substrate after the gate stack and the first gate spacer layer are formed by implanting impurity ions using the first gate spacer layer as a mask;
    forming a second gate spacer layer on at least one side of the first gate spacer layer; and
    forming a second deep impurity region in the semiconductor substrate by implanting impurity ions using the second gate spacer layer as a mask, wherein the second deep impurity region is formed by implanting ions equal to the p-type ions implanted on the polysilicon layer.

2. The method of claim 1, wherein, in implanting the impurity ions using the second gate spacer layer as a mask to form the second deep impurity region, p-type impurities are implanted with an energy of 10 to 20 keV.

3. The method of claim 1, further comprising performing a diffusion process to diffuse the implanted impurity ions after implanting the impurity ions to form the second deep impurity region.

4. The method of claim 3, wherein said performing a diffusion process is performed at a temperature about 700 to 1050 degree Celsius and $N_2$ atmosphere for about 5 to 30 seconds.

* * * * *